United States Patent

Skrobis et al.

(10) Patent No.: US 7,673,541 B2
(45) Date of Patent: Mar. 9, 2010

(54) COLORED RAZOR BLADES

(75) Inventors: Kenneth J. Skrobis, Maynard, MA (US); Alfred Porcaro, Everett, MA (US); Ronald J. Swanson, Norwell, MA (US); Eric Liu, Lexington, MA (US)

(73) Assignee: The Gillette Company, Boston, MA (US)

( * ) Notice: Subject to any disclaimer, the term of this patent is extended or adjusted under 35 U.S.C. 154(b) by 15 days.

(21) Appl. No.: 10/860,928

(22) Filed: Jun. 3, 2004

(65) Prior Publication Data

US 2005/0268470 A1 Dec. 8, 2005

(51) Int. Cl.
*B26B 21/60* (2006.01)
*C23C 14/06* (2006.01)

(52) U.S. Cl. .......... 76/104.1; 30/346.54; 148/276; 148/285; 148/287; 427/419.2

(58) Field of Classification Search .......... 76/104.1; 30/346.53, 346.54; 148/284, 285, 287, 276; 427/419.2
See application file for complete search history.

(56) References Cited

U.S. PATENT DOCUMENTS

| | | | |
|---|---|---|---|
| 188,159 A | 3/1877 | McAllister | |
| 1,092,925 A | 4/1914 | Machlet | |
| 1,732,244 A * | 10/1929 | Salzman | 148/646 |
| 1,734,554 A | 11/1929 | Behrman | |
| 1,736,920 A | 11/1929 | Kinzel | |
| 1,748,378 A | 2/1930 | Armstrong | |
| 1,772,866 A | 8/1930 | Hirsch | |
| 1,887,504 A | 11/1932 | Frost | |
| 2,032,963 A * | 3/1936 | Voltmann | 148/287 |
| 2,073,501 A * | 3/1937 | Stargardter | 148/284 |
| 2,073,502 A * | 3/1937 | Stargardter | 30/346.53 |
| 2,131,505 A * | 9/1938 | Garsson | 148/633 |
| 2,137,817 A * | 11/1938 | Tuerff | 148/284 |
| 3,480,483 A * | 11/1969 | Wilkinson | 148/276 |
| 3,652,342 A | 3/1972 | Fischbein et al. | 148/6.35 |
| 3,664,884 A * | 5/1972 | Underwood | 148/242 |
| 3,743,551 A * | 7/1973 | Sanderson | 428/623 |
| 3,754,329 A | 8/1973 | Lane | 30/346.53 |
| 3,774,703 A * | 11/1973 | Sanderson | 428/600 |
| 3,879,844 A | 4/1975 | Griffiths | 30/34 |
| 3,916,523 A * | 11/1975 | Lane et al. | 428/624 |
| 4,012,551 A | 3/1977 | Bogaty et al. | 428/192 |
| 4,022,947 A | 5/1977 | Grubb et al. | 428/432 |
| 4,281,456 A | 8/1981 | Douglass et al. | 30/89 |
| 4,453,987 A | 6/1984 | Arai et al. | 148/15.5 |
| 4,470,895 A | 9/1984 | Coad et al. | |
| 4,586,255 A | 5/1986 | Jacobson | 30/41 |

(Continued)

FOREIGN PATENT DOCUMENTS

DE   2 249 050   * 9/1975

(Continued)

*Primary Examiner*—Hwei-Siu C Payer
(74) *Attorney, Agent, or Firm*—Dara M. Kendall; Kevin C. Johnson; Steven W. Miller (57) ABSTRACT

Colored razor blades are provided. Methods for manufacturing such blades are also provided, including methods involving depositing an oxide coating prior to heat treatment of the blade material and heat treating under conditions selected to enhance the color of the coating.

5 Claims, 5 Drawing Sheets

U.S. PATENT DOCUMENTS

| | | | | |
|---|---|---|---|---|
| 4,933,058 | A | 6/1990 | Bache et al. | 204/192.3 |
| 4,981,756 | A * | 1/1991 | Rhandhawa | 428/336 |
| 5,032,243 | A | 7/1991 | Bache et al. | 204/192.34 |
| 5,232,568 | A | 8/1993 | Parent et al. | 204/192.3 |
| 5,236,439 | A | 8/1993 | Kozikowski | 30/50 |
| 5,263,256 | A | 11/1993 | Trankiem | 30/346.54 |
| 5,295,305 | A | 3/1994 | Hahn et al. | 30/50 |
| 5,458,025 | A | 10/1995 | Neamtu | 76/104.1 |
| 5,477,756 | A | 12/1995 | Trankiem et al. | 76/104.1 |
| 5,497,550 | A | 3/1996 | Trotta et al. | 30/50 |
| 5,531,401 | A | 7/1996 | Newcomb | 244/31 |
| 5,543,183 | A | 8/1996 | Streckert et al. | 427/529 |
| 5,603,161 | A | 2/1997 | Welsh | 30/41.7 |
| 5,669,144 | A | 9/1997 | Hahn et al. | 30/346.54 |
| 5,701,788 | A | 12/1997 | Wilson et al. | 76/104.1 |
| 5,724,868 | A * | 3/1998 | Knudsen et al. | 76/104.1 |
| 5,794,354 | A | 8/1998 | Gilder | 30/530 |
| 5,918,369 | A | 7/1999 | Apprille, Jr. et al. | 30/47 |
| 5,940,975 | A | 8/1999 | Decker et al. | 30/346.54 |
| 5,985,459 | A | 11/1999 | Kwiecien et al. | 428/421 |
| 6,076,264 | A * | 6/2000 | Meckel | 30/225 |
| 6,272,061 | B1 | 8/2001 | Kato et al. | 365/225.7 |
| 6,436,546 | B1 | 8/2002 | Gulikers et al. | 428/469 |
| 6,684,513 | B1 * | 2/2004 | Clipstone et al. | 30/346.54 |
| 7,284,461 | B2 * | 10/2007 | Skrobis et al. | 76/104.1 |
| 2004/0121159 | A1 * | 6/2004 | Cloud et al. | 428/421 |

FOREIGN PATENT DOCUMENTS

| | | | |
|---|---|---|---|
| DE | 1 553 843 | * | 2/1976 |
| DE | 3533238 A1 | | 3/1987 |
| GB | 1 149 781 | | 4/1969 |
| GB | 1 416 887 | | 12/1975 |
| JP | 50 79447 | * | 6/1975 |
| JP | 03-100161 | | 4/1991 |
| WO | WO92/19425 | | 11/1992 |
| WO | WO92/21286 | | 12/1992 |

* cited by examiner

High Temp Furnace strip direction

COLORED RAZOR BLADES

TECHNICAL FIELD

This invention relates to razor blades and processes for manufacturing razor blades, and more particularly to colored razor blades.

BACKGROUND

Razor blades are typically formed of a suitable metallic sheet material such as stainless steel, which is slit to a desired width and heat-treated to harden the metal. The hardening operation utilizes a high temperature furnace, where the metal may be exposed to temperatures greater than 1100° C. for up to 10 seconds, followed by quenching.

After hardening, a cutting edge is formed on the blade. The cutting edge typically has a wedge-shaped configuration with an ultimate tip having a radius less than about 1000 angstroms, e.g., about 200–300 angstroms.

Various coatings may be applied to the cutting edge. For example, hard coatings such as diamond, amorphous diamond, diamond-like carbon (DLC) material, nitrides, carbides, oxides or ceramics are often applied to the cutting edge or the ultimate tip to improve strength, corrosion resistance and shaving ability. Interlayers of niobium or chromium containing materials can aid in improving the binding between the substrate, typically stainless steel, and the hard coatings. A polytetrafluoroethylene (PTFE) outer layer can be used to provide friction reduction.

It is important that these coatings be applied, and any other post-hardening processing steps be performed, under sufficiently low temperature conditions so that the hardened, sharpened steel is not tempered. If the steel is tempered it will lose its hardness and may not perform properly during use.

Examples of razor blade cutting edge structures and processes of manufacture are described in U.S. Pat. Nos. 5,295,305; 5,232,568; 4,933,058; 5,032,243; 5,497,550; 5,940,975; and 5,669,144; which are hereby incorporated by reference.

SUMMARY

The present invention provides razor blades that include a colored coating, i.e., a coating having a color different from the color of the underlying blade material. The term "colored" as used herein, includes all colors, including black and white. The colored coating provides a desirable aesthetic effect, without deleteriously affecting the performance or physical properties of the blade. The color of the razor blades can be color-coordinated with the color of the housing of a razor cartridge or the handle or other components of a shaving system. In some preferred implementations, the coating covers substantially the entire blade surface, enhancing the aesthetic effect and simplifying manufacturing. The coatings are durable, exhibit excellent adhesion to the blade material, and can be produced consistently and relatively inexpensively.

In one aspect, the invention features a razor blade for use in a wet shaving system, including a blade formed of a metallic sheet material and having a sharpened cutting edge, and a colored coating disposed on at least a portion of the blade.

Some implementations may include one or more of the following features. The colored coating covers substantially the entire blade. The coating includes a metallic oxide, and/or metallic oxynitride, e.g., titanium oxide, and/or other transition metal oxides including zirconium, aluminum, silicon, tungsten, tantalum, niobium, iron, and mixtures thereof. The metallic sheet material comprises stainless steel, e.g., martensitic stainless steel. The coating has a color selected from the group consisting of gold, violet, green and blue. The coating has a thickness of from about 300 to 10,000 Angstroms, e.g., from about 600 to 2400 Angstroms.

The method may include additional steps. For example, the method may further include heating the blade material prior to or during the applying step and/or ion bombardment of the blade material prior to or during the applying step.

The invention also features methods of producing colored coatings that do not deleteriously affect the final properties of the blade. For example, in one aspect the invention features a method that includes applying an oxide coating to a blade material, subjecting the coated blade material to a hardening process, and forming the hardened coated blade material into a razor blade, the oxide coating providing the razor blade with a colored coating.

In some preferred methods, the coating is applied to a relatively large sheet of metal, from which a great many blades can be manufactured. For example, the applying step may be performed on a sheet of blade material having a width substantially greater than the width of the razor blade. In this case, the method may further include, between the applying and subjecting steps, slitting the blade material to form a plurality of strips. Some methods involve a substantially continuous coating and heat-treating process. The method may also include controlling the hardening process so that the composition of the oxide coating is changed by the hardening process.

Some methods may include one or more of the following features. The controlling step includes controlling the ambient conditions under which the hardening process is performed. For example, the controlling step may include providing a chamber within which the hardening process is performed, and introducing one or more gases to the chamber during the hardening process. The gases are selected from the group consisting of nitrogen, hydrogen, and oxygen, carbon monoxide, carbon dioxide, nitrogen oxide, nitrogen dioxide, water vapor, and mixtures thereof.

The hardening process includes passing the blade material through a first temperature zone which reduces the oxide coating and a second temperature zone which oxidizes the coating. The hardening process is performed in a tunnel oven, and the first temperature zone is a first zone of the tunnel oven and the second temperature zone is a second, shorter zone of the tunnel oven in which the temperature can be controlled independently of the temperature in the first zone of the tunnel oven. The oxygen partial pressure in the second zone of the tunnel oven can be controlled independently of the ambient conditions in the first zone of the tunnel oven. By controlling the oxygen partial pressure in the second zone of the tunnel oven, the desired color of the oxide film may be further targeted and controlled. The hardening process may result in martenization of the blade material.

In some methods, the forming step includes sharpening the blade material to form a cutting edge. The forming step may also include breaking the slitted blade material into portions having substantially the same length as the razor blade.

The method further includes applying a coating to the cutting edge to enhance the shaving performance of the cutting edge. The coating is selected from the group consisting of chromium containing materials, niobium containing materials, diamond coatings, diamond-like coatings (DLC), nitrides, carbides, oxides, and telomers. The method further includes selecting the stoichiometry composition of the oxide coating so as to give a desired final color.

In a further aspect, the invention features a wet shaving system that includes a razor including a blade formed of a metallic sheet material and having a sharpened cutting edge, the blade having a colored coating disposed on at least a portion of the blade. The blade may include any of the features discussed above.

The term "colored," as used herein, refers to a coating having a color that is different from the color of the uncoated substrate material to which the coating is applied.

The term "colorized coating," as used herein, refers to a colored coating that has been heat treated to enhance its coloration.

The details of one or more embodiments of the invention are set forth in the accompanying drawings and the description below. Other features and advantages of the invention will be apparent from the description and drawings, and from the claims.

DETAILED DESCRIPTION

Figure 1:
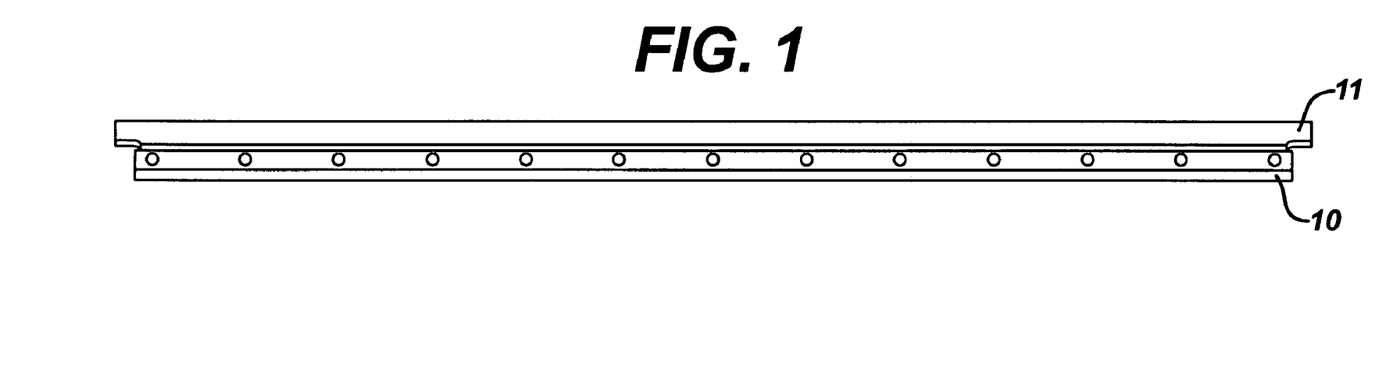
FIG. 1 is a top view.
Figure 1A:
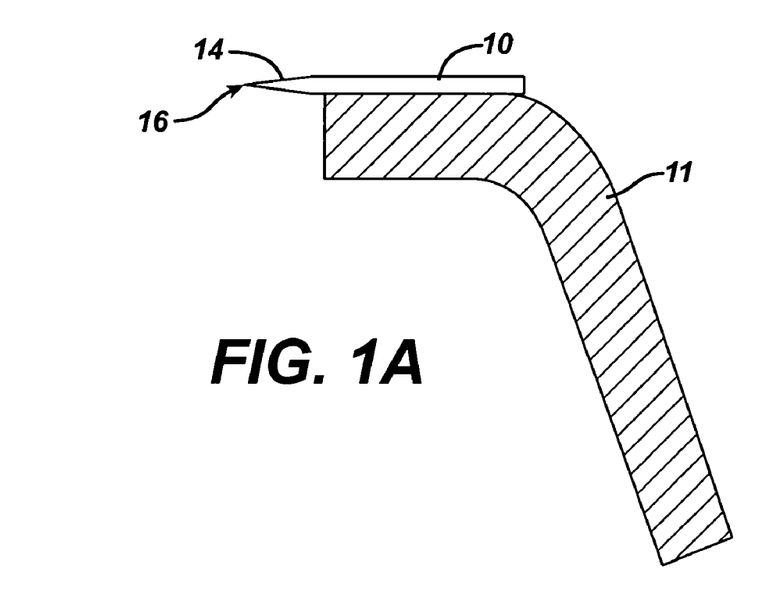
FIG. 1A is a side view of a supported razor blade.

Referring to FIGS. 1 and 1A, razor blade 10 includes a stainless steel substrate, which typically has a thickness of about 0.003 to 0.004 inch. The stainless steel has been hardened to its martensitic phase. The blade 10 has a cutting edge 14 (sometimes referred to as the "ultimate edge" of the blade) that has been sharpened to a tip 16. Preferably, tip 16 has a radius of less than 1,000 angstroms, preferably 200 to 400 angstroms, measured by SEM. Typically, tip 16 has a profile with side facets at an included angle of between 15 and 30 degrees, e.g., about 19 degrees, measured at 40 microns from the tip.

Blade 10 includes a very thin, e.g., 300 to 10,000 Angstrom, colored coating. This coating is not visible in FIGS. 1 and 1A due to the scale of these figures. The colored coating is preferably formed of an oxide that is selected and applied so as to provide a desired color to the finished blade, and to withstand the high temperature hardening process and other blade processing steps without a deleterious color change or other damage or deterioration.

Suitable oxides include oxides of titanium and other transition metals, such as zirconium, aluminum, silicon, tungsten, tantalum, niobium, iron, and mixtures of these oxides.

Figure 2:
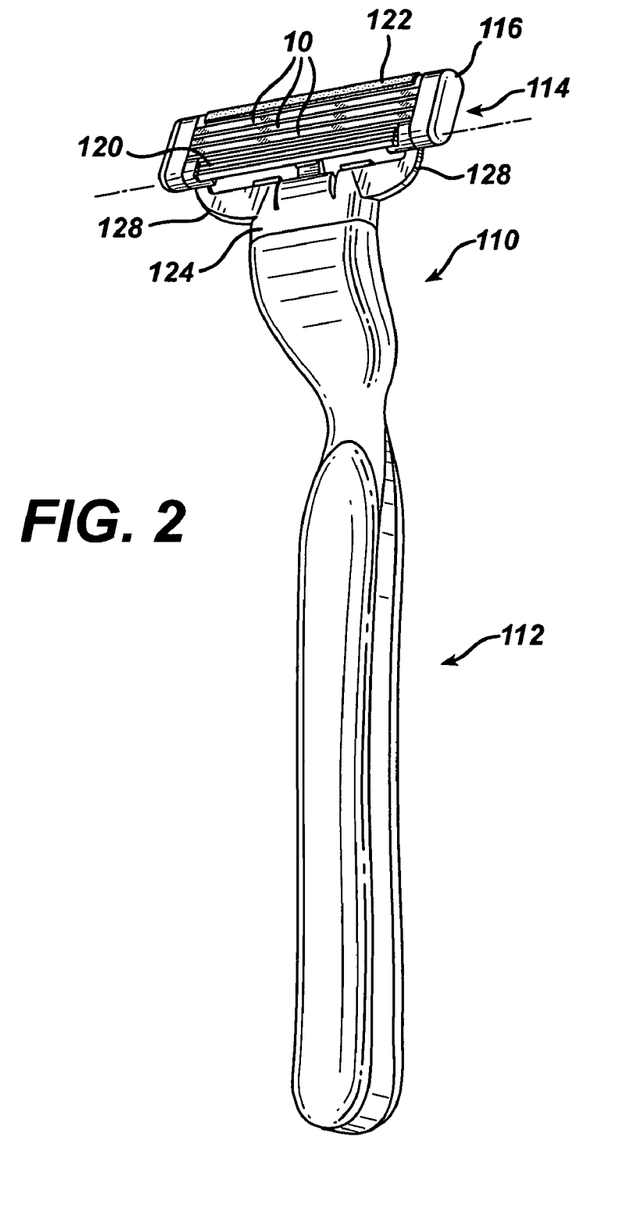
FIG. 2 is a perspective view of a shaving razor including the FIG. 1 razor blade.

Referring to FIG. 2, blade 10 can be used in shaving razor 110, which includes a handle 112 and a replaceable shaving cartridge 114. Cartridge 114 includes housing 116, which carries three blades 10, a guard 120 and a cap 122. Each blade 10 is welded to a support 11, and the blades 10 and their supports 11 are movably mounted, as described, e.g., in U.S. Pat. No. 5,918,369, which is incorporated herein by reference. Cartridge 114 also includes an interconnect member 124 on which housing 116 is pivotally mounted at two arms 128.

As discussed above, the color of the blade may be coordinated with the color of the housing or handle, or a portion of the housing or handle, to create a pleasing and distinctive aesthetic effect. For example, the color of the coating may be the same as, and/or contrasting or complementary with the color(s) of the housing and/or handle. The color of the coating may also be coordinated with that of elastomeric portions of the cartridge, e.g., the guard.

Blade 10 can be used in other types of razors, for example razors having one, two or three or more blades, or double-sided blades. Blade 10 can be used in razors that do not have movable blades or pivoting heads. The cartridge may either be replaceable or be permanently attached to a razor handle.

Figure 3:
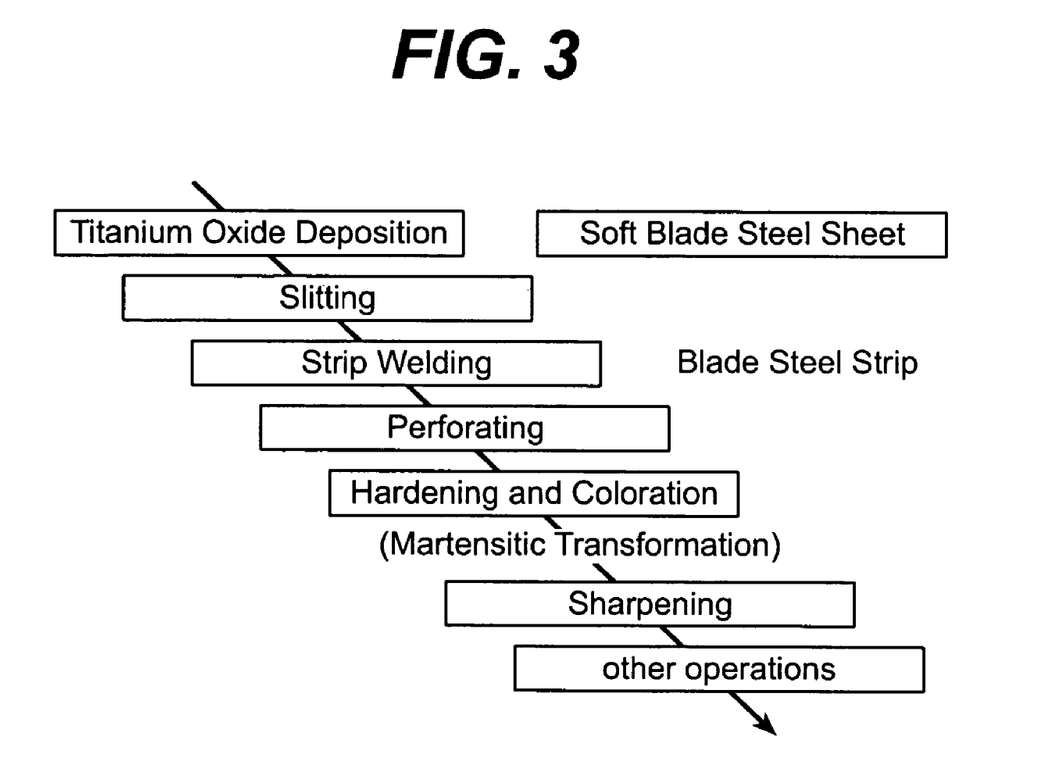
FIG. 3 is a flow diagram showing steps in a razor blade manufacturing process according to one embodiment of the invention.

A suitable process for applying the colored coating and manufacturing the razor blade is shown diagrammatically in FIG. 3. As shown in FIG. 3, preferably, the oxide layer is applied to the sheet material from which the blade is formed, prior to the slitting of the sheet material to a desired width that is typically significantly wider than the final blade width. Performing the coating step at this stage simplifies manufacturing, because a large surface area can be coated at once. The oxide coating is applied to a sheet of soft blade steel, e.g., by physical vapor deposition (PVD), plasma enhanced chemical vapor deposition (PECVD), or other deposition technique, in a layer of uniform thickness. The layer is typically about 400 to 10,000 Angstroms, for example about 500 to 800 Angstroms. The substrate may be heated prior to and/or during deposition, e.g., to a temperature of about 100° C. to 350° C. Heating the substrate in this manner may increase the adhesion and wear resistance of the oxide coating. The oxide coating may be deposited on top of a thin adhesion-promoting layer of a non-oxidized metal, e.g., chromium, titanium, or other non-oxidized metals. This adhesion-promoting layer may be applied to the sheet of soft blade steel, e.g., by physical vapor deposition (PVD), and can have thickness of between 50 and 250 angstroms. If desired, the coating may be pre-applied by a supplier, prior to the other processing steps shown in FIG. 3. The oxide coating can be deposited by a number of techniques, including evaporation (a PVD technique), sputtering (PVD), arc sources (PVD), plasma enhanced chemical vapor deposition (PECVD), and other techniques such as sol-gel processing, and thermal growth of films. The process parameters to be used will depend upon the technique and tooling used, and are selected so as to produce an oxide layer having the desired thickness and other properties.

After the coating is applied, the sheet material is slit into strips, and the strips are perforated for ease of handling during subsequent processing. Other pre-hardening steps, such as scoring, may be performed, if desired.

Figure 4:
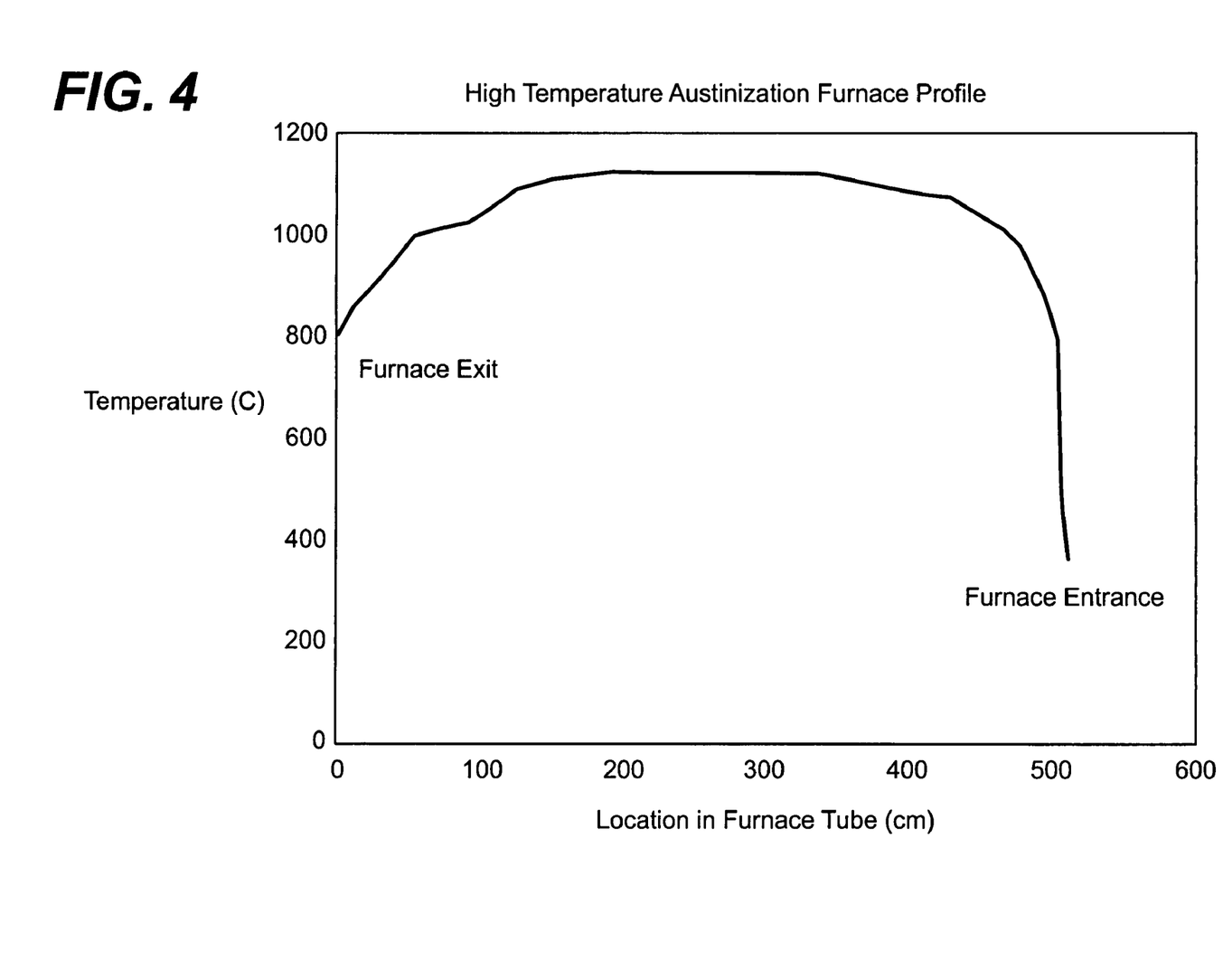
FIG. 4 is a temperature profile for a hardening furnace.

When the desired sequence of pre-hardening steps has been completed, the blade material is subjected to a hardening process, which results in martensitic transformation of the stainless steel. A typical temperature profile for the hardening process, which is conducted in a tunnel oven, is shown in FIG. 4. This temperature profile within the oven involves quickly ramping the temperature of the material up to a high temperature, e.g., approximately 1160° C., maintaining the material at this temperature for a period of time, during which austenization of the stainless steel occurs. After the material exits the oven, it is rapidly quenched, causing martenization of the stainless steel.

The processes described below may be added to existing blade steel hardening processes. Advantageously, in many cases the colorization processes described herein can be integrated into an existing hardening process with minimal changes to the existing process. One existing blade steel hardening process utilizes a high temperature furnace (greater than 1100° C.) containing a flowing Forming Gas (a mixture of hydrogen and nitrogen) ambient. Two parallel continuous stainless steel blade strips are pulled through this high temperature furnace at 36.6 m/min (120 ft/min) each. This high temperature treatment is used to austinitize the stainless steel strips. Near the exit of the high temperature furnace is a water-cooled jacketed tube (also referred to as the water-cooled muffle tube). This section is used to start the cooling process of the stainless steel blade strips. Just after the water-cooled zone, the stainless steel blade strips are pulled through a set of water-cooled quench blocks. The quench blocks initiate the martensitic transformation of the steel.

During the hardening process, the oxide coating is "colorized," i.e., the coloration of the oxide coating is enhanced and/or changed. Colorization may result in an enhancement of the color, for example to a brighter shade or more brilliant appearance, and/or may result in a change of the color of the coating to a different color, e.g., from blue-gray to violet, gold, or blue, or from dull-green to bright green-yellow, dark green, or blue-green. This colorization results from a change in the refractive index of the coating, which in turn results from a change in the composition, stoichiometric composition, and/or the crystalline structure of the oxide coating. The degree of change in the apparent film index of refraction will control the color of the colorized film.

The composition and crystalline structure of the coating after colorization, and thus the final color of the coating, will depend on several variables. For example, the composition, or stoichiometry, of the coating will depend on the gases that are present in the furnace during the hardening procedure. Introducing only nitrogen into the furnace will generally change an initially gray-blue colored titanium oxide coating to bright blue or blue-violet. This color change is due to a reduction in the oxygen content of the titanium oxide coating. If air and/or moisture is introduced to the furnace, the reduction in the oxygen content of the titanium oxide coating is much less, and the resulting index of refraction is higher.

Other variables that affect colorization are the initial thickness and composition of the oxide coating, the temperature profile of the hardening furnace, and the speed at which the material travels through the furnace. If the thickness and/or composition of the coating vary over the length of the material, it may be necessary to adjust the process parameters of the hardening process in order to obtain a consistent end product. Because it is difficult to rapidly adjust the temperature and ambient conditions in the large tunnel ovens that are typically used for hardening, it may be desirable to provide a separate, shorter oven that is more rapidly adjustable (referred to below as "the Oxidation Zone"). Thus, the conventional, large tunnel oven may be used for the high temperature step of the hardening operation and to slightly reduce the oxide coating (which may also increase the uniformity of its composition), and the additional, shorter oven may be used for oxidation/colorization, providing an oxidization zone in which the gas composition can be relatively quickly adjusted to compensate for variations in the material. The strip temperature in this Oxidization Zone, and hence the coloration ambient responsiveness, can be adjusted up or down, by adjusting the set point of the last zones of the high temperature furnace. The composition and/or flow rate of the gas(es) introduced to the Oxidization Zone can then be altered, based on the appearance of the material as it exits the Oxidation Zone and quenching area.

Other processes may be used to obtain colorized coatings using the oxides discussed above, particularly titanium oxide (or any stoichiometry of oxidized titanium), as the thin film. In these processes, either the ambient conditions (composition and temperature) within the high temperature furnace and/or the Oxidation Zone are adjusted to control the color of the colorized coating.

The Oxidation Zone, when utilized, is located between the high temperature furnace and the first set of water-cooled quench blocks, and replaces the water-cooled muffle tube used on a standard hardening line. The furnace temperature profile may be modified so that the coated stainless steel blade strips emerge from the hardening furnace and enter the Oxidation Zone at a temperature near or below 1160° C. Addition of heating elements to the Oxidation Zone may also be employed to improve the stability of the process, such as during start-up.

Figure 5:
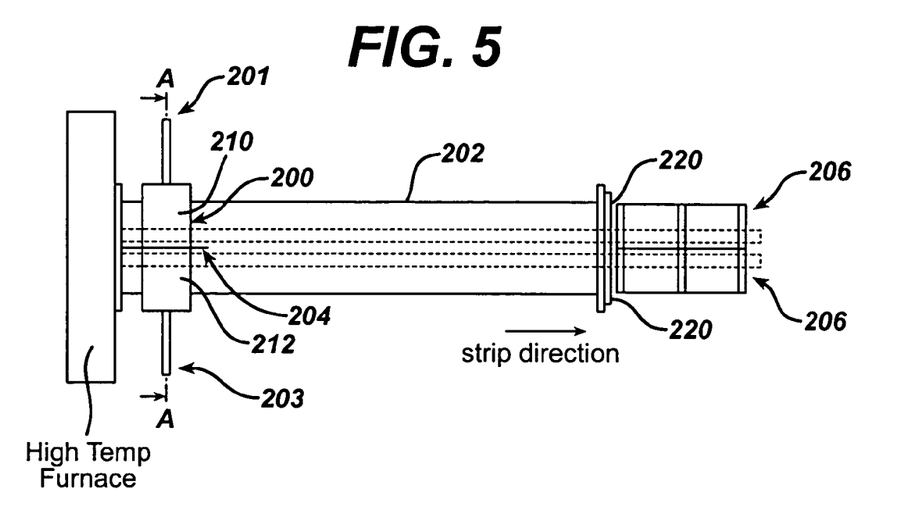
FIG. 5 is a diagrammatic side view of an oxidization zone.
Figure 5A:
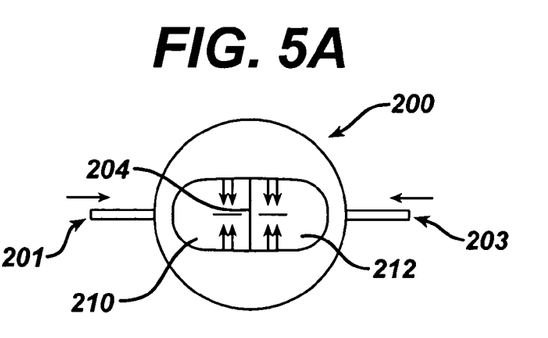
FIG. 5A is a diagrammatic cross-sectional view of a sparger, taken along line A—A in FIG. 5.
Figure 5B:
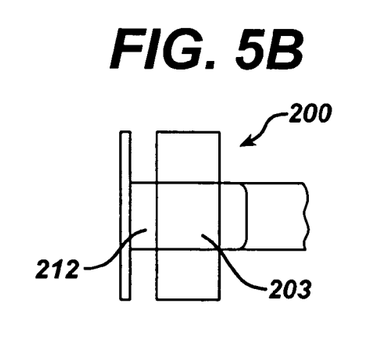
FIG. 5B is a side view of the sparger shown in FIG. 5A.
Figure 5C:
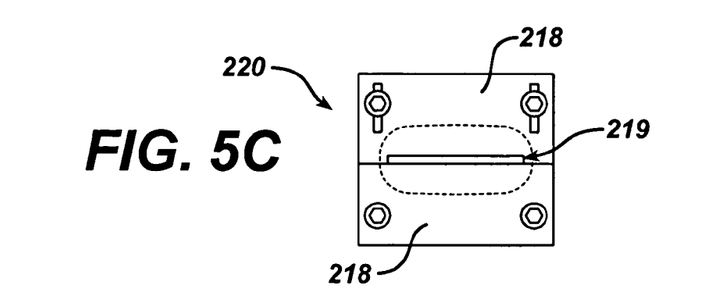
FIG. 5C is a front view of an exit gate used with the oxidation zone shown in FIG. 5.

The Oxidation Zone may be, for example, an Inconel tube attached to the tubing used in the high temperature furnace of the hardening line. Referring to FIG. 5, in one embodiment a gas sparger system 200 is installed about 2.9 cm from the entrance of the tube 202 and dimensioned to extend 5.1 cm down the tube. In this case, the sparger has a total of 16 inlet gas ports (not shown), and is designed so that gas injected through the sparger (arrows, FIG. 5A) will uniformly impinge upon the stainless steel strips. Gas is introduced to the sparger through a pair of inlet tubes 201, 203. A gas baffle 204 may be included so that the two stainless steel strips of blade material are separated from each other so that the gas composition on each side of the baffle may be independently controlled. The baffle 204 may define two chambers 210, 212, as shown in FIG. 5A. In this case, the gas baffle may, for example, begin 0.3 cm from the entrance of the Oxidation Zone and extend down the tube 10.2 cm. If desired, the gas baffle may extend along the entire length of the Oxidation Zone. The gas sparger is designed so that dual gas flow control is possible, allowing two strips to be processed at the same time, using the same furnace. Gas flow rates may be controlled using gas flow meters. The exit of each chamber of the Oxidation Zone may be equipped with a flange and two pieces of steel 218 which define a slit 219 and thereby act as an exit gate 220 (FIG. 5C). The slit may be, for example, 0.1 to 0.2 cm wide. This exit gate prevents any back-flow of ambient air into the Oxidation Zone and also encourages better mixing of the gases within the Oxidation Zone. As discussed above, just after the Oxidation zone, the stainless steel blade strips are pulled through a set of water-cooled quench blocks 206. The quench blocks initiate the martensitic transformation of the steel.

The oxidation gas, for example a mixture of oxygen and nitrogen introduced as dry air and nitrogen, may be used to control the coloration process, in which case it is added directly to the flow of gases from the high temperature furnace.

All of the processes described above allow a decorative transition metal oxide film to be specially modified (colorized) during the hardening process of a martensitic stainless steel. If, instead, a decorative transition metal oxide film were colorized prior to the hardening process, it would generally be degraded during the standard hardening process. If a coloration process were employed after the martensitic transformation, it would generally either destroy the martensitic properties of the stainless steel strip, or would require extensive temperature control and special material handling. The processes described above generally provide highly adherent, protective oxides, while allowing excellent color control and without detrimentally impacting the metallurgic properties of the hardened stainless steel blade strips.

After the hardening process, the blade material is sharpened, to create the cutting edge shown in FIG. 1, and the strip of blade material is broken into blades of the desired length.

The blades may then be welded, e.g., using laser welding, to the support 11 (FIG. 2), if such a support is to be used.

In addition to the colored coating, the razor blade may include other features, such as performance enhancing coatings and layers, which may be applied between the sharpening and welding steps.

For example, the tip may be coated with one or more coatings, as discussed in the Background section above. Suitable tip coating materials include, but are not limited to, the following:

Suitable interlayer materials include niobium and chromium containing materials. A particular interlayer is made of niobium having a thickness of from about 100 to 500 angstroms. PCT 92/03330 describes use of a niobium interlayer.

Suitable hard coating materials include carbon-containing materials (e.g., diamond, amorphous diamond or DLC), nitrides (e.g., boron nitride, niobium nitride or titanium nitride), carbides (e.g., silicon carbide), oxides (e.g., alumina, zirconia) and other ceramic materials. Carbon containing hard coatings can be doped with other elements, such as tungsten, titanium or chromium by including these additives, for example, in the target during application by sputtering. The hard coating materials can also incorporate hydrogen, e.g., hydrogenated DLC. DLC layers and methods of deposition are described in U.S. Pat. No. 5,232,568.

Suitable overcoat layers include chromium containing materials, e.g., chromium or chromium alloys that are compatible with polytetrafluoroethylene, e.g., CrPt. A particular overcoat layer is chromium having a thickness of about 100–500 angstroms.

Suitable outer layers include polytetrafluoroethylene, sometimes referred to as a telomer. A particular polytetrafluoroethylene material is Krytox LW 1200 available from DuPont. This material is a nonflammable and stable dry lubricant that consists of small particles that yield stable dispersions. It is furnished as an aqueous dispersion of 20% solids by weight and can be applied by dipping, spraying, or brushing, and can thereafter be air-dried or melt coated. The layer is preferably 100 to 5,000 angstroms thick, e.g., 1,500 to 4,000 angstroms. Provided that a continuous coating is achieved, reduced telomer coating thickness can provide improved first shave results. U.S. Pat. Nos. 5,263,256 and 5,985,459, which are hereby incorporated by reference, describe techniques which can be used to reduce the thickness of an applied telomer layer.

For example, the razor blade tip may include a niobium interlayer, a DLC hard coating layer, a chromium overcoat layer, and a Krytox LW1200 polytetrafluoroethylene outer coat layer.

The following examples are intended to be illustrative and not limiting in effect.

GENERAL COLORIZED COATING PROCESS SET-UP, EXAMPLES 1–4

In the following examples, Examples 1–4, samples of a stainless steel sheet material having a 650 Angstrom coating of titanium oxide were heat treated in a high temperature furnace with hardening temperature profiles shown in FIG. 4. The exit of the high temperature furnace was equipped with an Oxidation Zone (Examples 1–3 only). The temperature profile of the high temperature furnace, as well as the gas ambient of the high temperature furnace, was controlled. Gases were also introduced to the Oxidation Zone in the final steps of the colorized coating process (Examples 1–3 only). The temperature in the high temperature furnace was set at 1160° C., and the last of the four zones (the exit temperature) was set at 1060° C.

Example 1

Nitrogen in High Temperature Furnace, Dry Air in Oxidation Zone Used for Color Control In this experiment, the high temperature furnace maintained the temperature profile shown in FIG. 4. The ambient within the high temperature furnace was flowing nitrogen (18.9 liters/min). The coated stainless steel sheet material was pulled through the furnace at 36.6 m/min (120 ft/min). A controlled mixture of nitrogen (1 liter/min) and dry air (0 to 225 m/min) was introduced to each side of the Oxidation Zone. The amount of air introduced to the Oxidation Zone established the final color of the colorized coating. The initial color of the samples was blue-gray. With no air flow to the Oxidation Zone, the final color was violet. As the air flow rate was increased to 25 ml/min, the color became a deep blue. At air flow rates greater than 200 ml/min, the color was a light blue. Use of the Oxidation Zone allowed for a rapidly responding coloration process, allowing for on-line color control. In this process, it is believed that the initial titanium oxide film was both densified and reduced, decreasing the apparent film index of refraction within the high temperature furnace. As the hot film was pulled through the Oxidation Zone, the increased oxygen ambient re-oxidized the film, increasing the apparent film index of refraction and thereby colorizing the film.

Example 2

Forming Gas in High Temperature Furnace; Dry Air in Oxidation Zone Used for Color Control The high temperature furnace contained an ambient of flowing Forming Gas (75% hydrogen, 25% nitrogen). Flow rates were set between 4.7 liters/min and 18.9 liters/min. A controlled mixture of nitrogen (1 liter/min) and dry air (0 to 225 ml/min) was introduced to each side of the Oxidation Zone. The amount of air introduced to the Oxidation Zone established the final color of the colorized coating. In this process, it is believed that the initial titanium oxide film was densified, reduced, and slightly nitrated. These changes decreased the apparent film index of refraction of the oxide film while the film was within the high temperature furnace. As the hot film was pulled through the Oxidation Zone, the increased oxygen ambient re-oxidized the film, increasing the apparent film index of refraction and modifying the color of the film. The process responsiveness and color variability, for a given film thickness, were reduced relative to the responsiveness and variability observed during the experiment described in Example 1.

Example 3

Forming Gas and Nitrogen in High Temperature Furnace; Dry Air in Oxidation Zone Used for Color Control In this experiment, the process parameters were the same as those described above for Example 2, except that nitrogen was added to the Forming Gas flow to decrease the overall hydrogen content. The Forming Gas flow was reduced to between 25% and 75% of the total gas flow within the high temperature furnace. The process color variability, for a given film thickness and range of air flow rates to the Oxidation Zone, was significantly reduced relative to the processes utilizing only Forming Gas or only Nitrogen in the High Temperature Furnace.

Example 4

Forming Gas and/or Nitrogen in High Temperature Furnace; Dry Air in High Temperature Furnace Used for Color Control; Oxidation Zone not used for Color Control In this experiment, the high temperature furnace contained an ambient of flowing Forming Gas (75% hydrogen, 25% nitrogen), nitrogen, and dry air. Each of the flow rates of the Forming Gas and nitrogen varied between 0 liters/min and 18.9 liters/min; with the total flow rate of Forming Gas plus nitrogen being between 4.7 liters/min and 18.9 liters/min. Dry air flow rates varied between 0 and 225 ml/min. No air or nitrogen was added to the Oxidation Zone, which was, in this experiment, a water-cooled jacketed muffle tube. The amount of air introduced to the front end of the high temperature furnace established the final color of the colorized coating. In this process, the oxidation state, and hence the apparent film index of refraction, was controlled by controlling the oxidation-reduction driving force within the high temperature furnace. This process allowed for a wider range of color control, relative to Examples 1–3.

Other embodiments are within the scope of the following claims. For example, while it is generally preferred, for ease of manufacturing, that the oxide coating be applied prior to slitting and perforation, the coating may be applied at any point in the manufacturing process prior to hardening. Moreover, in some processes the perforating and/or welding step(s) shown in FIG. 3 may be omitted. Other process steps may be added if desired, for example a scoring operation may be performed prior to perforation.

What is claimed is:

1. A method of manufacturing a razor blade comprising
   applying an oxide coating to a blade material wherein said blade material comprises stainless steel;
   subjecting the coated blade material to a hardening process wherein such hardening comprises subjecting said material to a furnace having a temperature of greater than about 1100° C.;
   subjecting the hardened material to oxidation;
   quenching the blade material to initiate martensitic transformation of the blade material; and
   forming the hardened coated blade material into a razor blade, the oxide coating providing the razor blade with a colored coating.

2. The method of claim 1 further comprising controlling the hardening process so that the composition of the oxide coating is changed by the hardening process.

3. The method of claim 2 wherein the controlling step includes controlling the ambient conditions under which the hardening process is performed.

4. The method of claim 3 wherein the controlling step includes providing a chamber within which the hardening process is performed, and introducing one or more gases to the chamber during the hardening process.

5. The method of claim 4 wherein the gases are selected from the group consisting of nitrogen, hydrogen, and oxygen, carbon monoxide, carbon dioxide, nitrogen oxide, nitrogen dioxide, water vapor, and mixtures thereof.

* * * * *